(12) United States Patent
Ohno et al.

(10) Patent No.: US 6,475,701 B2
(45) Date of Patent: Nov. 5, 2002

(54) ACTIVE ENERGY BEAM CURABLE COMPOSITION AND PRINTED WIRING BOARD

(75) Inventors: Takao Ohno, Saitama (JP); Ken Ito, Saitama (JP); Ichiro Miura, Saitama (JP)

(73) Assignee: Tamura Kaken Corporation, Saitama (JP)

( * ) Notice: Subject to any disclaimer, the term of this patent is extended or adjusted under 35 U.S.C. 154(b) by 80 days.

(21) Appl. No.: 09/782,381

(22) Filed: Feb. 12, 2001

(65) Prior Publication Data

US 2002/0115739 A1 Aug. 22, 2002

(30) Foreign Application Priority Data

Feb. 14, 2000 (JP) .......................... 2000-034807

(51) Int. Cl.$^7$ .............................. C08F 2/48; C03F 7/032
(52) U.S. Cl. ................... 430/280.1; 522/109; 522/111; 522/113; 522/120; 522/134; 522/143; 522/100; 522/170; 430/281.1; 430/286.1; 430/270.1; 430/288.1; 428/694 BC; 428/901; 428/500
(58) Field of Search ................. 522/170, 113, 522/120, 134, 143, 100, 109, 110, 111; 430/56, 75, 280.1, 281.1, 286.1, 270.1, 288.1; 428/694 BC, 901, 500

(56) References Cited

U.S. PATENT DOCUMENTS

| | | | |
|---|---|---|---|
| 4,898,656 A | * 2/1990 | Hoshino et al. | |
| 5,009,982 A | 4/1991 | Kamayachi et al. | |
| 5,639,560 A | * 6/1997 | Moens et al. | 428/482 |
| 5,770,347 A | * 6/1998 | Saitoh et al. | 430/280.1 |
| 5,992,473 A | * 11/1999 | Hammonds | 141/100 |
| 6,005,017 A | * 12/1999 | Daly et al. | 522/107 |
| 6,017,640 A | * 1/2000 | Muthiah et al. | 427/189 |

FOREIGN PATENT DOCUMENTS

JP    H1-54390    11/1989

* cited by examiner

Primary Examiner—James J. Seidleck
Assistant Examiner—Sanza L. McClendon
(74) Attorney, Agent, or Firm—King & Schickli, PLLC

(57) ABSTRACT

There is provided an active energy beam curable composition, which is useful for forming a solder resist film for a printed wiring board, which can be developed through an ultraviolet exposure and a dilute alkali aqueous solution, and is excel lent in heat resistance, adhesivity and chemical resistance. There is also proposed a printed wiring board provided with a cured film of such an active energy beam curable composition. This composition is featured in that it comprises not only an active energy beam curable vinyl copolymer modified resin wherein an epoxy compound having an ethylenic unsaturated group is added to a copolymer comprising styrene, (metha)acrylic acid, and, as an optional component, (metha)acrylate; but also an active energy beam curable bisphenol type epoxyacrylate resin.

20 Claims, No Drawings

ACTIVE ENERGY BEAM CURABLE COMPOSITION AND PRINTED WIRING BOARD

This application claims priority to Japanese Patent Application No. 2000-34807, filed Feb. 14, 2000.

BACKGROUND OF THE INVENTION

The present invention relates to an active energy beam curable composition such as a photosensitive resin composition, which is useful for forming a patterned image through an ultraviolet exposure and a development using a dilute alkali aqueous solution, is tack-free to an exposure film for forming the patterned image, is capable of providing a pattern which is excellent in adhesivity, electric insulating property, soldering heat resistance and chemical resistance, and is suited for use as a solder resist for manufacturing a printed wiring board. The present invention also relates to a printed wiring board provided with a cured film of the active energy beam curable composition.

The printed wiring board is provided on the substrate thereof with conductive circuit patterns including soldering lands on which electronic components are mounted by means of soldering. The entire circuit patterns excluding the soldering lands are covered with a solder resist film functioning as a permanent protective film. Due to the existence of this solder resist film, a solder is prevented from being adhered to unnecessary portions on the occasion of soldering electronic parts onto the printed wiring board, and at the same time, the conductive circuits from being directly exposed to air and hence from being oxidized or eroded by moisture.

Conventionally, a thermosetting type resist is extensively employed as this solder resist, the thermosetting type resist being generally applied by way of a screen printing method. However, due to recent trend to further increase the density of wiring of the printed wiring board, the screen printing method is limited in terms of the resolution. As a result, a photo-solder resist to be used for forming a pattern by means of photographic method has been increasingly employed at present.

However, according to the conventional photo-solder resists, since a harmful organic solvent such as 1,1,1-trichloroethane is employed in the development of the resists, it is impossible to avoid the problems such as bad influence on human body, environmental pollution, etc. Meanwhile, an alkali-development type resist which is capable of being developed by making use of a weak alkali solution such as sodium carbonate solution is being developed. For example, Japanese Patent Publication H1-54390 discloses a photosensitive resin composition comprising an active energy beam curable resin to be derived from a reaction between a reaction product of novolac type epoxy resin with an unsaturated monocarboxylic acid and a saturated or unsaturated polybasic acid anhydride.

However, the photosensitive resin composition disclosed in Japanese Patent Publication H1-54390 is not only insufficient in terms of properties such as exposure sensitivity, resolution, chemical resistance, solvent resistance, but also defective in that the coated surface thereof is tacky even if it is dried by volatilizing a solvent after coating it on a printed wiring board so that when a negative film which is once contacted with the coated surface is peeled off after the exposure thereof, part of the coated film is caused to adhere to the negative film, thereby making it difficult to reuse the negative film which is designed to be repeatedly used.

BRIEF SUMMARY OF THE INVENTION

Therefore, a first object of this invention is to provide an active energy beam curable composition of alkali-development type, which is excellent in properties such as exposure sensitivity, resolution, solvent resistance, in particular very excellent in heat resistance, adhesivity and chemical resistance, and also excellent in workability. This object also includes a printed wiring board which is provided with a cured film of such an active energy beam curable composition.

A second object of this invention is to provide an active energy beam curable composition which is useful for forming a coated film which is tack-free to an exposure film for forming a patterned image. This object also includes a printed wiring board which is provided with a cured film of such an active energy beam curable composition.

Namely, according to the present invention, there is provided (1) an active energy beam curable composition comprising;

(A) an active energy beam curable vinyl copolymer modified resin to be derived by adding an epoxy compound represented by the following general formula (4) to part of carboxylic group of a copolymer containing at least monomers represented by the following general formulas (1) and (3) among the monomers represented by the following general formulas (1), (2) and (3);

(B) an active energy beam curable bisphenol type epoxy-acrylate resin;

(C) a reactive diluent;

(D) a photopolymerization initiator; and (E) a thermosetting compound.

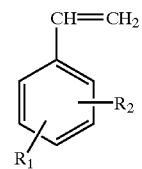

(General formula 1)

wherein $R_1$ represents hydrogen atom or an aliphatic hydrocarbon group having 1 to 6 carbon atoms; and $R_2$ represents hydrogen atom, hydroxyl group or alkoxyl group.

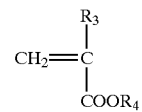

(General formula 2)

wherein $R_3$ represents hydrogen atom or methyl; and $R_4$ represents an aliphatic hydrocarbon group having 1 to 6 carbon atoms or an aromatic group.

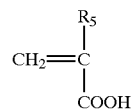

(General formula 3)

wherein $R_5$ represents hydrogen atom or methyl.

(General formula 4)

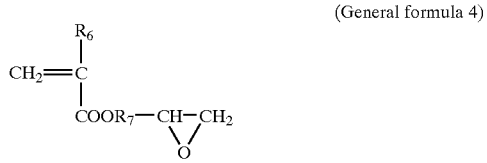

wherein $R_6$ represents hydrogen atom or methyl; $R_7$ represents an alkylene group having 1 to 12 carbon atoms or an aromatic group.

This invention further provides (2) an active energy beam curable composition according to the aforementioned item (1), wherein the active energy beam curable vinyl copolymer modified resin (A) has an average molecular weight of 5,000 to 70,000.

This invention further provides (3) an active energy beam curable composition according to the aforementioned item (1) or (2), wherein the active energy beam curable vinyl copolymer modified resin (A) has an acid value of 50 to 150.

This invention further provides (4) an active energy beam curable composition according to any one of the aforementioned item (1) to (3), wherein the ratio of the monomer represented by the general formula (1) in the copolymer is at least 20 mole %.

This invention further provides (5) an active energy beam curable composition according to any one of the aforementioned item (1) to (4), wherein the ratio added of the epoxy Compound represented by the general formula (4) to a quantity used of the monomer represented by the general formula (3) in the copolymer is in the range of 20 to 70 mole %.

This invention further provides (6) an active energy beam curable composition according to any one of the aforementioned item (1) to (5), wherein the active energy beam curable bisphenol type epoxyacrylate resin (B) is a compound to be derived by using as a reactive component a resin selected from the group consisting of bisphenol A epoxy resin, bisphenol F epoxy resin and bisphenol S epoxy resin.

This invention further provides (7) an active energy beam curable composition according to any one of the aforementioned item (1) to (6), wherein the reactive diluent (C) is a photopolymerizable monomer, at least one kind of which is employed at a ratio of 2 to 40 g per 100 g of the active energy beam curable vinyl copolymer modified resin (A).

This invention further provides (8) an active energy beam curable composition according to any one of the aforementioned item (1) to (7), wherein at least one kind of the photopolymerization initiator (D) is employed at a ratio of 0.2 to 30 g per 100 g of the active energy beam curable vinyl copolymer modified resin (A).

This invention further provides (9) an active energy beam curable composition according to any one of the aforementioned item (1) to (8), wherein at least one kind of the thermosetting compound (E) is employed at a ratio of 5 to 100 g per 100 g of the active energy beam curable vinyl copolymer modified resin (A).

This invention further provides (10) a printed wiring board which is covered with a solder resist film constituted by a cured film of the active energy beam curable compositions according to any one of the aforementioned item (1) to (9).

DETAILED DESCRIPTION OF THE INVENTION

According to this invention, the active energy beam curable compositions may be constituted by an active energy beam curable composition for a photosolder resist. Further, the coated film may be formed from those which are capable of being developed by making use of a dilute alkali solution after the exposure thereof. Furthermore, the active energy beam curable compositions may be constituted by a photosensitive resin composition.

The active energy beam curable vinyl copolymer modified resin (A) according to this invention is formed of a copolymer (carboxyl-containing prepolymer) to which an epoxy compound having one epoxy group represented by the aforementioned general formula (4) and at least one ethylenic unsaturated group is added; wherein the copolymer is formed of copolymer components consisted of styrene represented by the aforementioned general formula (1), i.e. styrene and derivatives thereof, and (metha)acrylic acid (at least one kind selected from acrylic acid and methacrylic acid) represented by the aforementioned general formula (3), which may contain, as an optional component, (metha)acrylate (at least one kind selected from acrylate and methacrylate) represented by the aforementioned general formula (2).

This component (A) has such a film-forming property that enables it to form a tack-free film which is capable of adhering onto a negative film on the occasion of exposure step. Further, the inclusion of this component (A) is particularly effective, for enabling the curable composition to be dissolved in a weak alkali solution (dilute alkali solution) such as sodium carbonate aqueous solution. This component (A) can be employed at a ratio of 10 to 95% (this % means mass %, the same hereinafter), preferably 20 to 70% based on the entire active energy beam curable composition comprising the aforementioned components (A) to (E). If the content of this component (A) is less than 10%, it would become impossible to perform the development of the curable composition using a weak alkali solution. On the other hand, if the content of this component (A) is more than 95%, the property of the cured film to be ultimately obtained will be deteriorated.

In this copolymer, the moiety corresponding to the aforementioned (metha)acrylic acid is particularly effective for enabling a coated film of the active energy beam curable vinyl copolymer modified resin (A) or of the active energy beam curable composition comprising the aforementioned components (A) to (E) to be dissolved in a weak alkali solution. Further, the moiety corresponding to the aforementioned styrene is particularly effective for improving the heat resistance of the coated film of the aforementioned resin or composition, in particular for providing the coated film with a sufficient heat resistance to the molten solder on the occasion of soldering. The moiety corresponding to the aforementioned (metha)acrylate is particularly effective for reforming the mechanical properties such as the softness of the coated film of the aforementioned resin or composition.

It is desirable in view of above that the content of styrene in the copolymer before the copolymer is modified with the epoxy compound represented by the aforementioned general formula (4) should be set to at least 20 mole %, more preferably within the range of 30 to 60 mole %, whereas the content of (metha)acrylic acid likewise should be set to within the range of 30 to 80 mole %, more preferably within the range of 40 to 70 mole %. When (metha)acrylate is further included in the copolymer in this case, the content of styrene should be set to at least 20 mole %, more preferably within the range of 25 to 50 mole %, the content of (metha)acrylic acid within the range of 20 to 70 mole %, more preferably within the range of 30 to 60 mole %, and the content of (metha)acrylate within the range of 10 to 40 mole %, more preferably within the range of 15 to 30 mole %.

It is also possible to copolymerize other kinds of acrylic monomer in addition to the above monomers at a ratio of 5 to 20 mole % based on the entire monomers, examples of such acrylic monomers being alkyl (metha)acrylate, hydroxyalkyl (metha)acrylate, acrylic amide, alkylated acrylic amide, alkyloled acrylic amide, acrylonitrile, etc. Examples of styrene derivative include. α-alkyl styrene, styrene substituted by cyclic compound, etc. Each of the aforementioned monomers may be employed singly or in combination thereof (at least two kinds, the same hereinafter).

As for the epoxy compound represented by the aforementioned general formula (4), which is adapted to be employed for modifying the aforementioned copolymer and has one epoxy group and at least one ethylenic unsaturated group, it is possible to employ glycidyl (metha)acrylate, allylglycidyl ether, α-ethylglycidyl (metha) acrylate, crotonylglycidyl ether, glycidyl crotonate, glycidyl isocrotonate, monoalkyl itaconate monoglycidyl ester, monoalkyl fumarate monoglycidyl ester, monoalkyl maleate monoglycidyl ester, pentaerythritol triacrylate monoglycidyl ether, etc. These compounds may be employed singly or in combination of two of more kinds.

This epoxy compound should preferably be reacted with the aforementioned copolymer at a ratio within the range of 10 to 60 g, more preferably within the range of 20 to 50 g per 100 g of the copolymer. If the ratio of the epoxy compound is less than the aforementioned lower limit, it would be impossible to provide the coated film of the active energy beam curable composition with a sufficient photosensitivity. On the other hand, if the ratio of the epoxy compound is more than the aforementioned upper limit, the developing property of the composition would be deteriorated, and also the viscosity stability of the composition would be deteriorated.

The active energy beam curable bisphenol type epoxyacryl ate resin (B) in this invention is particularly effective for enhancing the adhesivity of coated film cured of the solder resist to the printed wiring board. This component (B) can be employed at a ratio within the range of 5 to 30 g, preferably within the range of 10 to 20 g per 100 g of the active energy beam curable vinyl copolymer modified resin (A). If the content of the component (B) is less than 5 g, it would be impossible to realize a sufficient adhesivity of the coated film cured of the solder resist. On the other hand, if the content of the component (B) is more than 30 g, it will give rise to an increase in tackiness of the coated film of solder resist before the exposure step thereof, this increase in tackiness being disadvantageous in executing the work in the exposure step, etc.

Specific examples of the active energy beam curable bisphenol type epoxyacryl ate resin (B) are those where bisphenol type epoxy resin is employed as a base, such as bisphenol A epoxy resin, bisphenol F epoxy resin and bisphenol S epoxy resin, to each of which (metha)acrylic acid or a polybasic acid anhydride is added. These epoxy resins can be employed singly or in combination of two or more kinds thereof.

The reactive diluent (C) in this invention is particularly effective for enhancing the photosensitivity of coated film. This component (C) can be employed at a ratio of 2 to 40 g per 100 g of the active energy beam curable vinyl copolymer modified resin (A). If the content of the component, (C) is less than 2 g, the photo-setting of the coated film containing the aforementioned components (A) to (E) would become insufficient, whereby the acid resistance of coated film after the curing thereof would become insufficient. On the other hand, if the content of the component (C) is more than 40 g, the tackiness of the coated film would become prominent, so that the adhesion of an artwork film to the substrate would more likely be caused on the occasion of exposure step thereof, thereby making it difficult to obtain a desired cured film. In view of the photocurability of coated film, the physical property of cured film, and the antisticking of the artwork film to the substrate, the preferable range of content of the reactive diluent (C) would be 4 to 30 g per 100 g of the active energy beam curable vinyl copolymer modified resin (A).

Specific examples of the reactive diluent (C) are 1,4-butanediol di(metha)acrylate, 1,6-hexanediol di(metha)acrylate, neopentylgylcol di(metha)acrylate, polyethylenegylcol di(metha)acrylate, neopentylgylcol adipate di(metha)acrylate, hydroxypivalic acid neopentylgylcol di(metha)acrylate, dicyclopentanyl di(metha)acrylate, caprolactone-modified dicyclopentanyl di(metha)acrylate, EO-modified phosphoric acid di(metha)acrylate, allylated cyclohexydil di(metha)acrylate, isocyanurate di(metha) acrylate, trimethylolpropane tri(metha)acrylate, dipentaerythritol tri(metha)acrylate, propionic acid-modified dipentaerythritol tri(metha)acrylate, pentaerythritol tri(metha)acrylate, PO-modified trimethylolpropane tri(metha)acrylate, tris(acryloxyethyl) isocyanurate, propionic acid-modified dipentaerythritol penta(metha)acrylate, dipentaerythritol hexa(metha)acrylate, caprolactone-modified dipentaerythritol hexa(metha)acrylate, etc. These diluents can be employed singly or in combination of two or more kinds.

The photopolymerization initiator (D) in this invention is useful for initiating the polymerization of polymerizable components among the aforementioned components (A) to (E) when the active energy beam is ultraviolet ray or visible light. This photopolymerization initiator (D) can be employed at a ratio of 0.2 to 30 g per 100 g of the active energy beam curable vinyl copolymer modified resin (A). If the content of the component (D) is less than 0.2 g, the photo-setting of the coated film containing the aforementioned components (A) to (E) would proceed insufficiently. On the other hand, if the content of the component (D) is more than 30 g, almost no improvement can be recognized in spite of the quantity increased of the component (D), thus making it disadvantageous in economical viewpoint, and still more, the mechanical property of the cured film maybe deteriorated. In view of the photocurability of coated film, economy and the mechanical property of cured film, the preferable range of content of the photopolymerization initiator (D) would be 1 to 15 g per 100 g of the active energy beam curable vinyl copolymer modified resin (A).

Specific examples of the photopolymerization initiator (D) are benzoin, benzoin methylether, benzoin ethylether, benzoin isopropylether, benzoin n-butylether, benzoin isobutylether, acetophenone, dimethylaminoacetophenone, 2,2-dimethoxy-2-phenyl acetophenone, 2-hydroxy-2-methyl-1-phenylpropan-1-one, 1-hydroxycyclohexylphenyl ketone, 2-methyl-1-[4-(methylthio)phenyl]-2-morpholinopropan-1-one, benzophenone, 2-methylanthraquinone, 2-ethylanthraquinone, 2-tertiary butylanthraquinone, 2-aminoanthraquinone, 2-methyl thioxanthone, 2-ethylthioxanthone, 2-chlorthioxanthone, 2,4-dimethylthioxanthone, 2,4-diethylthioxanthone, benzyldimethyl ketal, acetophenone dimethyl ketal, p-dimethylaminoethyl benzoate, etc. These compounds can be employed singly or in combination of two or kinds.

The thermosetting compound (E) in this invention is the component which is cured when a coated film of the composition containing the aforementioned components (A) to (E) is heat-treated after the exposure thereof. This thermosetting compound (E) is particularly effective in improving the properties of the coated film such as the film strength, heat resistance, durability, chemical resistance, resistance to environment, etc. This thermosetting compound (E) can be employed at a ratio of 5 to 100 g per 100 g of the active energy beam curable vinyl copolymer modified resin (A). If the content of the component (E) is less than 5 g, it would be impossible to obtain a coated film having desired properties after the post-curing, i.e. heat curing after the exposure of coated film of the composition containing the aforementioned components (A) to (E). On the other hand, if the content of thermosetting compound (E) is more than 100 g, the ratio of other components having polymerizability will be decreased since this component (E) is not a polymerizable component, so that photo-curable property of the composition may be deteriorated. Therefore, in view of the physical property of the film after the post-curing, and the photo-curable property of the composition, the preferable range of content of the thermosetting compound (E) would be within the range of 10 to 70 g per 100 g of the active energy beam curable vinyl copolymer modified resin (A).

As for the specific examples of the thermosetting compound (E), known epoxy resins (including epoxy oligomers) having at least one epoxy group, more preferably 2 or more epoxy groups in the molecule thereof are preferable. However, the thermosetting compound (E) is not confined to such epoxy resins. Specific examples of such known epoxy resins are glycidyl-based epoxy resin such as bisphenol A epoxy resin which can be derived from the reaction between bisphenol A and epichlorohydrin in the presence of an alkali, an epoxidized product of a resin to be derived from a condensation reaction between bisphenol A and formalin, epoxy resins of the same kind as described above except that bromized bisphenol A is substituted for the aforementioned bisphenol A, novolac type epoxy resin (phenol novolac type, o-cresol novolac type, p-t-butylphenol novolac type, etc.) to be derived from a glycidyl-etherification reaction between novolac resin and epichlorohydrin, bisphenol F epoxy resin which can be derived from the reaction between bisphenol F and epichlorohydrin, bisphenol S epoxy resin which can be derived from the reaction between bisphenol S and epichlorohydrin, and bisphenyl type epoxy resin. It is also possible to employ, as such epoxy resins, alicyclic epoxy resins containing cyclohexene oxide group, tricyclodecan oxide or cyclopentene oxide group, glycidyl ester resins such as diglycidyl phthalate, diglycidyl tetrahyrophthalate, diglycidyl hexahyqrophthalate, diglycidyl-p-oxybenzoic acid and dimer acid glycidyl ester, glycidyl amine-based resin such as tetragylcidyl diaminodiphenyl methane, triglycidyl-p-aminophenol, etc., and triglycidyl isocyanurate having a triazine ring.

If the active energy beam curable composition of this invention is to be employed as a photosolder resist composition, in addition to the aforementioned components (A) to (E), it is possible to also employ, in view of improving the physical properties, workability and storage stability, a pigment (F), a latent heat-cure promoter (G) for the above component (E), an organic solvent (H) for adjusting viscosity, and other additives (1) at a ratio within the range of 0.1 to 20%. These additives can be employed singly or in combination of two or more kinds.

As for the pigment (F), it is possible to employ an inorganic pigment such as silica, alumina, talc, calcium carbonate and barium sulfate; or organic pigment such as phthalocyanine type pigments and azo type pigments.

As for the latent heat-cure promoter (G), it is possible to employ a boron trifluoride-amine complex, dicyandiamide (DICY) and the derivatives thereof, organic acid hydrazide, diaminomaleonitrile (DAMN) and the derivatives thereof, melamine and the derivatives thereof, guanamine and the derivatives thereof, amineimide (AI), polyamine salt, azoles, etc.

As for the organic solvent (H), it is possible to employ methylethyl ketone, cyclohexanone, toluene, xylene, Cellosolve, butyl Cellosolve, carbitol, butyl carbitol, ethyl acetate, butyl acetate, Cellosolve acetate, butyl Cellosolve acetate, carbitol acetate, butyl carbitol acetate, etc.

As for the other additives (1), it is possible to employ additives for coating material such as antifoamer and leveling agent, silane coupling agent, etc.

The active energy beam curable composition of this invention can be obtained by a process wherein the aforementioned components (A) to (E) and, if required, at least one of the components (F) to (I) are mixed together, and then further .kneaded or mixed, if required, by making use of kneading means such as a three-roll mill, a ball mill and a sand mill; or making use of mixing means such as a super mixer, a planetary mixer, etc. If the active energy beam curable composition thus obtained is to be employed as a photosolder resist composition, it is coated on a printed wiring board having a copper circuit thereon to a thickness of about 5 to 100 μm. As for the coating means, although a full coating by means of screen printing method is generally employed at present, there is not any particular limitation with regard to the coating method as long as it is capable of uniformly coating the composition on the surface of the printed wiring board. For example, it is possible to employ a spray coater, a hot melt coater, a bar coater, an applicator, a blade coater, a knife coater, an air knife coater, a curtain flow coater, a roll coater, a gravure coater, an off-set printing, a dip coating, a brush coating, or any other known methods.

After the coating of the active energy beam curable composition has been finished, the resultant coated layer is subjected, if required, to a pre-baking, i.e. a provisional drying by making use of a hot stove or a far-infrared furnace, thereby turning the surface of the coated layer into a tack-free state. The temperature of this pre-baking should preferably be set to about 50 to 100° C. Thereafter, a negative mask having active energy beam-impermeable negative regions and active energy beam-permeable negative regions is employed to perform the exposure of the coated layer by means of active energy beam. As for the negative mask, it is possible to employ a negative film if the active energy beam is ultraviolet rays, to employ a metallic mask if the active energy beam is electronic beam, or to employ a lead mask if the active energy beam is X-rays. However, ultraviolet rays are most frequently employed as the active energy beam for enabling a simple negative film to be employed. The exposure dose of ultraviolet rays is set to about 10 to 1,000 mJ/cm$^2$.

After the exposure, the development of the coated layer is performed by means of spraying or dipping using, as a developing solution, a weak alkali solution such as a dilute aqueous solution of sodium carbonate, thereby removing the unexposed portions by way of dissolution, swelling or peel-off. Thereafter, by making use of a hot stove or a far-infrared furnace, the coated layer is heated with an accompaniment of UV irradiation, thereby performing the post-curing of the coated layer. As a result, a photosolder resist film is formed on the printed wiring board.

The printed wiring board having a covering of the photosolder resist film is then employed for mounting electronic components by means of soldering method or reflow soldering method, thereby connecting or fixing the electronic components to the printed wiring board, thus forming an electronic circuit unit.

This invention includes within the scope thereof not only a printed wiring board having a covering of the photosolder resist film without electronic components being mounted thereon but also a printed wiring board having a covering of the photosolder resist film with electronic components being mounted thereon.

The aforementioned component (A) can be constructed as follows. Namely, 30 to 50 mole % of at least one kind selected from styrene and 4-hydoxystyrene as monomers represented by the aforementioned general formula (1) and 50 to 70 mole % of at least one kind selected from methacrylic acid and acrylic acid as monomers represented by the aforementioned general formula (3) are copolymerized to form a copolymer. Alternatively, where the monomer represented by the aforementioned general formula (2) is employed, 25 to 50 mole % of at least one kind selected from styrene and: 4-hydoxystyrene as monomers, 30 to 60 mole % of at least one kind selected from methacrylic acid and acrylic acid, and 15 to 30 mole % of lower alkyl (metha) acrylate such as ethyl methacrylate are copolymerized to form a copolymer. Then, 100 g of any one of these copolymers is reacted with 20 to 50 g of glycidyl (metha)acrylate as an epoxy compound represented by the aforementioned general formula (4) to obtain an active energy beam curable vinyl copolymer modified resin (A) having an average molecular weight of 10,000 to 40,000 as measured by GPC (gel permeation method) method and an acid value of 80 to 120.

The aforementioned component (B) can be constructed as follows. Namely, bisphenol A epoxy resin is reacted with (metha)acrylic acid in such a manner that the equivalence ratio between epoxy group and carboxyl group becomes 1:1 to thereby obtain bisphenol A epoxyacrylate, which is then reacted with hexahydroxy phthalate anhydride at a ratio of 0.1 to 0.7 equivalent weight per equivalent weight of the hydroxyl group of hexahydroxy phthalate anhydride, thereby obtaining the active energy beam curable bisphenol A epoxyacrylate resin (B).

Then, 100 parts by weight of the above defined component (A), 10 to 20 parts by weight of the above defined component (B), 5 to 10 parts by weight of 2-methyl-1-[4-(methylthio)phenyl]-2-morpholino-1-propane as the aforementioned component (D), 5 to 15 g of trimethylolpropane triacrylate as the aforementioned component (C), 20 to 40 parts by weight of at least one kind of resin selected from the group consisting of triglycidyl tris(2-hydroxyethyl) isocyanurate, triglycidyl isocyanurate, bisphenol A epoxy resin, bisphenyl epoxy resin and novolac epoxy resin as the aforementioned component (E), and optionally, 0.1 to 1.0 part by weight of phthalocyanine green as the aforementioned component (F) and 5 to 10 parts by weight of talc are mixed together to obtain a photosensitive resin composition as an active energy beam curable composition.

This photosensitive resin composition is then coated on the surface of a printed wiring board having a copper foil circuit pattern and dried to form a coated layer, which is then subjected to exposure through an exposure film and to development. Thereafter, the developed film is heated to thermally cure to obtain a printed wiring board having a cured solder resist film.

Thereafter, electronic components are mounted on the printed wiring board by means of soldering to obtain a printed wiring board having electronic components mounted thereon.

Since the solder resist film of the printed wiring board thus obtained contains styrene as copolymer components in the component (A), the thermally cured film after the exposure is enabled to improve the heat resistance on the occasion of soldering, and at the same time, the coated film before the exposure step and after the drying thereof is excellent in tack-free property. Furthermore, since the component (B) is included in the film thermally cured after the exposure, it is possible to improve not only the adhesion of the film to a printed wiring board but also the chemical resistance (acid resistance, gold plating resistance, etc.). Further, the inclusion of the component (B) is also effective in improving the sensitivity on the occasion of exposure, developing property, electric properties such as insulating property, and solvent resistance of the film.

EXAMPLES

This invention will be further explained with reference to the following examples which are not intended to limit this invention. The "%" in these examples represents "mass %".

Synthesis Example 1

104 g (50 mole %) of styrene, 86 g (50 mole %) of methacrylic acid and 4 g of azoisobutyronitrile (AIBN) were dissolved in 261 g of carbitol acetate, thereby allowing a reaction to take place under a heating condition to obtain a carboxyl group-containing prepolymer having 42.1% of solid content. Then, 71 g of glycidyl methacrylate and hydroquinone (as a polymerization inhibitor) were added to this prepolymer so as to allow a reaction to take place until the acid value thereof became the theoretical value, thereby obtaining an active energy beam curable vinyl copolymer modified resin (at) having a solid content of 50%.

The average molecular weight (GPC method, the same hereinafter) of this resin was 30,000 and the acid number thereof was 107.

Synthesis Example 2

62.4 g (30 mole %) of styrene, 86 g (50 mole %) of methacrylic acid, 45.6 g (20 mole %) of ethyl methacrylate, land 4 g of azoisobutyronitrile (AIBN) were dissolved in 265 g of carbitol acetate, thereby allowing a reaction to take place under a heating condition to obtain a carboxyl group-containing prepolymer having 42.2% of solid content. Then, 71 g of glycidyl methacrylate and hydroquinone (as a polymerization inhibitor) were added to this prepolymer so as to allow a reaction to take place until the acid number thereof: became the theoretical value, thereby obtaining an active energy beam curable vinyl copolymer modified resin (a2) having a solid content of 50%.

The average molecular weight of this resin was 27,000 and the acid value thereof was 105.

Synthesis Example 3

62.4 g (30mole %) of styrene, 72 g (50 mole %) of acrylic acid, 45.6 g (20 mole %) of ethyl methacrylate, and 4 g of azoisobutyronitrile (AIBN) were dissolved in 251 g of carbitol acetate, thereby allowing a reaction to take place under a heating condition to obtain a carboxyl group-containing prepolymer having 41.7% of solid content. Then, 71 g of glycidyl methacrylate and hydroquinone (as a polymerization inhibitor) were added to this prepolymer so as to allow a reaction to take place until the acid value thereof became the theoretical value, thereby obtaining an active energy beam curable vinyl copolymer modified resin (a3) having a solid content of 50%.

The average molecular weight of this resin was 25,000 and the acid number thereof was 111.

Synthesis Example 4

120 g (50 mole %) of 4-hydroxystyrene, 86 g (50 mole %) of methacrylic acid, and 4 g of azoisobutyronitrile (AIBN) were dissolved in 277 g of carbitol acetate, thereby allowing a reaction to take place under a heating condition to obtain a carboxyl group-containing prepolymer having 42.6% of solid content. Then, 71 g of glycidyl methacrylate and hydroquinone (as a polymerization inhibitor) were added to this prepolymer so as to allow a reaction to take place until the acid value thereof became the theoretical value, thereby obtaining an active energy beam curable vinyl copolymer modified resin (a4) having a solid content of 50%.

The average molecular weight of this resin was 20,000 and the acid value thereof was 101.

Synthesis Example 5

72 g (30 mole %) of 4-hydroxystyrene, 86 g (50 mole %) of methacrylic acid, 45.6 g (20 mole %) of ethyl methacrylate and 4 g of azoisobutyronitrile (AIBN) were dissolved in 275 g of carbitol acetate, thereby allowing a reaction to take place under a heating condition to obtain a carboxyl group-containing prepolymer having 42.5% of solid content. Then, 71 g of glycidyl methacrylate and hydroquinone (as a polymerization inhibitor) were added to this prepolymer so as to allow a reaction to take place until the acid value thereof became the theoretical value, thereby obtaining an active energy beam curable vinyl copolymer modified resin (a5) having a solid content of 50%.

The average molecular weight of this resin was 22,000 and the acid value thereof was 102.

Synthesis Example 6

480 g of bisphenol A epoxy resin (Yuka Shell Co., Ltd., Epicoat 1001, epoxy equivalent: 480), and 72 g of acrylic acid were dissolved in 380 g of carbitol acetate, thereby allowing a reaction to take place at reflux to obtain bisphenol A epoxy acrylate. Then, 77 g of hexahydrophthalate anhydride added to this epoxy acrylate so as to allow a reaction to take place at reflux until the acid value thereof became the theoretical value, thereby obtaining a solution of active energy beam curable bisphenol type epoxy acrylate resin (b1) having a solid content of 65 wt %.

Synthesis Example 7

86 g (50 mole %) of methacrylic acid, 114 g (50 mole %) of ethyl methacrylate, and 4 g of azoisobutyronitrile (AIBN) were dissolved in 271 g of carbitol acetate, thereby allowing a reaction to take place under a heating condition to obtain a carboxyl group-containing prepolymer having 42.5% of solid content. Then, 71 g of glycidyl methacrylate and hydroquinone (as a polymerization inhibitor) were added to this prepolymer so as to allow a reaction to take place until the acid value thereof became the theoretical value, thereby obtaining an active energy beam curable vinyl copolymer modified resin (c1) having a solid content of 50%.

The average molecular weight of this resin was 30,000 and the acid number thereof was 103.

Synthesis Example 8

72 g (50 mole %) of acrylic acid, 114 g (50 mole %) of ethyl methacrylate, and 4 g of azoisobutyronitrile (AIBN) were dissolved in 257 g of carbitol acetate, thereby allowing a reaction to take place under a heating condition to obtain a carboxyl group-containing prepolymer having 42.0% of solid content. Then, 71 g of glycidyl methacrylate and hydroquinone (as a polymerization inhibitor) were added to this prepolymer so as to allow a reaction to take place until the acid value thereof became the theoretical value, thereby obtaining an active energy beam curable vinyl copolymer modified resin (c2) having a solid content of 50%.

The average molecular weight of this resin was 21,000 and the acid value thereof was 109.

Synthesis Example 9

104 g (50 mole %) of styrene, 98 g (50 mole %) of maleic anhydride, and 4 g of azoisobutyronitrile (AIBN) were dissolved in 318 g of carbitol acetate, thereby allowing a reaction to take place under a heating condition to obtain an acid anhydride group-containing prepolymer having 38.8% of solid content. Then, 116 g of hydroxyethyl acrylate and hydroquinone (as a polymerization inhibitor) were added to this prepolymer so as to allow a reaction to take place until the acid value thereof became the theoretical value, thereby obtaining an active energy beam curable vinyl copolymer modified resin (c3) having a solid content of 50%.

The average molecular weight of this resin was 35,000 and the acid value thereof was 170.

Example 1 all of the following components were mixed together at a ratio, i.e. 100 g of the active energy beam curable vinyl copolymer modified resin (a1) obtained in Synthesis Example 1, 20 g of a solution of active energy beam curable bisphenol type epoxy acrylate resin (b1) obtained in Synthesis Example 6, 8.0 g of 2-methyl-1-[4-(methylthio)phenyl]-2-morpholino-1-propane, 8.0 g of trimethylolpropane triacrylate, 30 g of triglycidyl tris(2-hydroxyethyl) isocyanurate, 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 1.

Example 2 all of the following components were mixed together at a ratio, i.e. 100 g of the active energy beam curable vinyl copolymer modified resin (a2) obtained in Synthesis Example 2, 20 g of a solution of active energy beam curable bisphenol type epoxy acrylate resin (b1) obtained in Synthesis Example 6, 8.0 g of 2-methyl-1-[4-(methylthio) phenyl]-2-morpholino-1-propane, 8.0 g of trimethylolpropane triacrylate, 30 g of triglycidyl tris(2-hydroxyethyl) isocyanurate, 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 1.

Example 3 all of the following components were mixed together at a ratio, i.e. 100 g of the active energy beam curable vinyl copolymer modified resin (a3) obtained in Synthesis Example, 3, 20 g of a solution of active energy beam curable bisphenol type epoxy acrylate resin (b1) obtained in Synthesis Example 6, 8.0 g of 2-methyl-1-[4-(methylthio) phenyl]-2-morpholino-1-propane, 8.0 g of trimethylopropane triacrylate, 30 g of triglycidyl tris(2-hydroxyethyl) isocyanurate, 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 1.

Example 4 all of the following components were mixed together at a ratio, i.e. 100 g of the active energy beam curable vinyl copolymer modified resin (a4) obtained in Synthesis Example 4, 20 g of a solution of active energy beam curable bisphenol type epoxy acrylate resin (b1) obtained in Synthesis Example 6, 8.0 g of 2-methyl-1-[4-(methylthio) phenyl]-2-morpholino-1-propane, 8.0 g of trimethylolpropane triacrylate, 30 g of triglycidyl tris(2-hydroxyethyl) isocyanurate, 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 1.

Example 5 all of the following components were mixed together at a ratio, i.e. 100 g of the active energy beam curable vinyl copolymer modified resin (a5) obtained in Synthesis Example 5, 20 g of a solution of active energy beam curable bisphenol type epoxy acrylate resin (b1) obtained in Synthesis Example 6, 8.0 g of 2-methyl-1-[4-(methylthio) phenyl]-2-morpholino-1-propane, 8.0 g of trimethylolpropane triacrylate, 30 g of triglycidyl tris(2-hydroxyethyl) isocyanurate, 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 1.

Example 6 all of the following components were mixed together at a ratio, i.e. 100 g of the active energy beam curable vinyl copolymer modified resin (a1) obtained in Synthesis Example 1, 20 g of a solution of active energy beam curable bisphenol type epoxy acrylate resin (b1) obtained in Synthesis Example 6, 8.0 g of 2-methyl-1-[4-(methylthio) phenyl]-2-morpholino-1-propane, 8.0 g of trimethylolpropane triacrylate, 30 g of bisphenol A epoxy resin (Yuka Shell Co., Ltd., Epicoat 828, epoxy equivalent: 190), 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 1.

Example 7 all of the following components were mixed together at a ratio, i.e. 100 g of the active energy beam curable vinyl copolymer modified resin (a1) obtained in Synthesis Example 1, 20 g of a solution of active energy beam curable bisphenol type epoxy acrylate resin (b1) obtained in Synthesis Example 6, 8.0 g of 2-methyl-1-[4-(methylthio) phenyl]-2-morpholino-1-propane, 8.0 g of trimethylolpropane triacrylate, 30 g of bisphenyl type epoxy resin (Yuka Shell Co., Ltd., YX-4000, epoxy equivalent: 190), 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 1.

Example 8 all of the following components were mixed together at a ratio, i.e. 100 g of the active energy beam curable vinyl copolymer modified resin (a1) obtained in Synthesis Example 1, 20 g of a solution of active energy beam curable bisphenol type epoxy acrylate resin (b1) obtained in Synthesis Example 6, 8.0 g of 2-methyl-1-[4-(methylthio) phenyl]-2-morpholino-1-propane, 8.0 g of trimethylolpropane triacrylate, 30 g of cresol novolac type epoxy resin (Dai Nippon Ink Manufacturing Co., Ltd., Epichlon N-660, epoxy equivalent: 220), 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 1.

Comparative Example 1 all of the following components were mixed together at a ratio, i.e. 100 g of the active energy beam curable vinyl copolymer modified resin (a1) obtained in Synthesis Example 1, 8.0 g of 2-methyl-1-[4-(methylthio)phenyl]-2-morpholino-1-propane, 8.0 g of trimethylolpropane triacrylate, 30 g of triglycidyl tris(2-hydroxyethyl) isocyanurate, 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 2.

Comparative Example 2 all of the following components were mixed together at a ratio, i.e. 100 g of the active energy beam curable vinyl copolymer modified resin (c1) obtained in Synthesis Example 7, 20 g of a solution of active energy beam curable bisphenol type epoxy acrylate resin (b1) obtained in Synthesis Example 6, 8.0 g of 2-methyl-1-[4-(methylthio) phenyl]-2-morpholino-1-propane, 8.0 g of trimethylolpropane triacrylate, 30 g of triglycidyl tris(2-hydroxyethyl) isocyanurate, 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 2.

Comparative Example 3 all of the following components were mixed together at a ratio, i.e. 100 g of the active energy beam curable vinyl copolymer modified resin (c2) obtained in Synthesis Example 8, 20 g of a solution of active energy beam curable bisphenol type epoxy acrylate resin (b1) obtained in Synthesis Example 6, 8.0 g of 2-methyl-1-[4-(methylthio) phenyl]-2-morpholino-1-propane, 8.0 g of trimethylolpropane triacrylate, 30 g of triglycidyl tris(2-hydroxyethyl) isocyanurate, 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 2.

Comparative Example 4 all of the following components were mixed together at a ratio, i.e. 100 g of the active energy beam curable vinyl copolymer modified resin (c3) obtained in Synthesis Example 9, 20 g of a solution of active energy beam curable bisphenol type epoxy acrylate resin (b1) obtained in Synthesis Example 6, 8.0 g of 2-methyl-1-[4-(methylthio)phenyl]-2-morpholino-1-propane, 8.0 g of trimethylolpropane triacrylate, 30 g of triglycidyl tris(2-hydroxyethyl) isocyanurate, 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 2.

Comparative Example 5 all of the following components were mixed together at a ratio, i.e. 100 g of the active energy beam curable vinyl copolymer modified resin (b1) obtained in Synthesis Example 6, 8.0 g of 2-methyl-1-[4-(methylthio)phenyl]-2-morpholino-1-propane, 8.0 g of trimethylolpropane triacrylate, 30 g of triglycidyl tris(2-hydroxyethyl) isocyanurate, 0.5 g of phthalocyanine green and 8 g of talc. The resultant mixture was kneaded using a three-roll mill to prepare a solution of active energy beam curable composition. The properties of coated film of this active energy beam curable composition are indicated in the following Table 2.

TABLE 1

| | Examples | | | | | | | |
|---|---|---|---|---|---|---|---|---|
| | 1 | 2 | 3 | 4 | 5 | 6 | 7 | 8 |
| Sensitivity | 11 | 10 | 11 | 11 | 10 | 11 | 11 | 11 |
| Hardness | 6 H | 6 H | 6 H | 6 H | 6 H | 6 H | 6 H | 6 H |
| Adhesivity | ⊚ | ⊚ | ⊚ | ⊚ | ⊚ | ⊚ | ⊚ | ⊚ |
| Heat resistance in soldering | ⊚ | ⊚ | ⊚ | ⊚ | ⊚ | ⊚ | ⊚ | ⊚ |
| Acid resistance | ⊚ | ⊚ | ⊚ | ⊚ | ⊚ | ⊚ | ⊚ | ⊚ |
| Solvent resistance | ○ | ○ | ○ | ○ | ○ | ○ | ○ | ○ |
| Au-plating resistance | ⊚ | ⊚ | ⊚ | ⊚ | ⊚ | ⊚ | ⊚ | ⊚ |
| Tack-free property | ⊚ | ⊚ | ⊚ | ⊚ | ⊚ | ⊚ | ⊚ | ⊚ |
| Electric properties | | | | | | | | |
| * Insulation resistance (Ω) | $3.0 \times 10^{12}$ | $5.0 \times 10^{12}$ | $1.0 \times 10^{12}$ | $1.0 \times 10^{12}$ | $3.0 \times 10^{12}$ | $3.0 \times 10^{12}$ | $5.0 \times 10^{12}$ | $1.0 \times 10^{12}$ |
| * Discoloration | ○ | ○ | ○ | ○ | ○ | ○ | ○ | ○ |

TABLE 2

| Comp. Examples | 1 | 2 | 3 | 4 | 5 |
|---|---|---|---|---|---|
| Sensitivity | 11 | 10 | 10 | 11 | 10 |
| Hardness | 5H | 6H | 6H | 6H | 6H |
| Adhesivity | Δ | Δ | Δ | Δ | ⊚ |
| Heat resistance in soldering | Δ | Δ | ○ | Δ | ○ |
| Acid resistance | Δ | Δ | Δ | Δ | ○ |
| Solvent resistance | ○ | ○ | ○ | ○ | ○ |
| Au-plating resistance | X | X | X | X | ○ |
| Tack-free property | ⊚ | ⊚ | ⊚ | ⊚ | Δ |
| Electric properties | | | | | |
| * Insulation resistance (Ω) | $1.0 \times 10^{12}$ | $3.0 \times 10^{12}$ | $1.0 \times 10^{12}$ | $4.0 \times 10^{12}$ | $3.0 \times 10^{12}$ |
| * Discoloration | ○ | ○ | ○ | ○ | ○ |

The properties, as a active energy beam curable composition, of the photosensitive resin compositions of above Examples and Comparative Examples were evaluated by the following methods.

(1) Sensitivity

A 21-stage step tablet was disposed to contact with a test substrate, and the test substrate was subjected to ultraviolet ray exposure at an exposure dose of 200 mJ/cm$^2$. After the development thereof using an alkaline solution, a maximum number of steps that were completely left remained in the coated film was evaluated. The larger the number of steps is, the more excellent is the light sensitivity of the film.

(2) Properties of Coated Film

A photosensitive resin composition was coated all over a copper foil substrate having a pattern formed thereon, and then dried for 20 minutes at a temperature of 80° C. Thereafter, a negative film was adhered onto the substrate and, after being exposed, the substrate was developed using 1% aqueous solution of sodium carbonate to form a pattern. Then, the substrate was thermally cured for 60 minutes at a temperature of 150° C. to prepare an assessment substrate having a cured film, on which the evaluation of properties thereof was performed. This corresponds to the example of printed wiring board.

(a) Hardness

The hardness was measured based on JIS K-5400 6.14.

(b) Adhesivity

The adhesivity was measured by means of cross-cut adhesion test based on JIS D 0202.

(c) Heat resistance in soldering

An assessment substrate having a cured film was dipped, according to the test method of JIS C 6481, in a solder tank heated to a temperature of 260° C. for 30 seconds, after which a peeling test using a cellophane tape was performed repeating this test cycle one to three times. Then, the feature of the resultant coated film was observed, evaluating the heat resistance thereof according to the following criterion.

⊚: No deformation was recognized in the coated film even after three test cycles.

○: The coated film was slightly deformed after three test cycles.

Δ: The coated film was deformed after two test cycles.

X: The coated film was peeled off after one test cycles.

(d) Acid resistance

An assessment substrate having a cured film was dipped in a 10% aqueous solution of sulfuric acid of normal temperature for 30 minutes, after which the substrate was washed with water and then a peeling test using a cellophane tape was performed to investigate the peeling and discoloring of the resist layer. The acid resistance of the coated film was evaluated according to the following criterion.

⊚: Neither the deformation nor discoloration was recognized at all in the coated film.

○: The deformation or discoloration of the coated film was slightly recognized.

Δ: Prominent deformation or discoloration of the coated film was recognized.

X: The coated film was swelled and peeled off.

(e) Solvent resistance

An assessment substrate having a cured film was dipped in methylene chloride of normal temperature for 30 minutes, after which the substrate was washed with water and then a peeling test using a cellophane tape was performed to investigate the peeling and discoloring of the resist layer. The solvent resistance of the coated film was evaluated according to the following criterion.

⊚: Neither the deformation nor discoloration was recognized at all in the coated film.

○: The deformation or discoloration of the coated film was slightly recognized.

Δ: Prominent deformation or discoloration of the coated film was recognized.

X: The coated film was swelled and peeled off.

(f) Au-plating resistance

An assessment substrate having a cured film was plated with gold, and then a peeling test using a cellophane tape was performed to investigate the peeling and discoloring of the resist layer. The Au-plating resistance of the coated film was evaluated according to the following criterion.

⊚: Neither the deformation nor discoloration was recognized at all in the coated film.

○: The deformation or discoloration of the coated film was slightly recognized.

Δ: Prominent deformation or discoloration of the coated film was recognized.

X: The coated film was swelled and peeled off.

(g) Tack-free property

A photosensitive resin composition was coated all over a copper foil substrate having a pattern formed, thereon, and then dried for 20 minutes at a temperature of 80° C. Thereafter, a negative film was adhered onto the substrate and, after being left to stand for several minutes, the negative film was peeled away from the substrate to evaluate the degree of adhesion of the coated film onto the negative film according to the following criterion.

⊚: Neither the adhesion nor trace of sticking was recognized at all.

○: A trace of sticking was recognized on the surface of the coated film.

Δ: Resistance was recognized on the occasion of peeling the negative film from the substrate.

X: Part of the coated film was adhered onto the negative film.

(h) Electric properties

An assessment substrate was manufactured under the aforementioned conditions, and 100V of DC current was impressed onto the assessment substrate by making use of a tandem type electrode, B coupon of IPC SM-840B B-25 in a thermohygrostat of 60° C. and 90% RH (relative humidity) so as to measure the insulation resistance of the substrate after 500 hours and also to observe the discloration of the coated film. The electric properties of the coated film was evaluated according to the following criterion.

⊚: No fluctuation in properties was recognized at all in the coated film.

○: A slight fluctuation in properties was recognized in the coated film.

Δ: A prominent fluctuation in properties was recognized in the coated film.

X: Burned black and stuck to the substrate.

By the way, with respect to the developing property described at the introduction portion of the above item (2), all of the samples of above Examples and Comparative Examples indicated excellent results.

It will be understood from each of the aforementioned Examples that in view of the comparison with Comparative Example 1, the co-use of the component (B) is advantageous, that in view of the comparison with Comparative Examples 2 and 3, the employment of styrene as the component (A) is advantageous, and that in view of the comparison with Comparative Examples 4 and 5, the employment of the component (A) is advantageous. Especially, the improvement of heat resistance is very significant in view of the fact that the melting point of leadless solder is higher than that of lead-containing solder.

According to this invention, it is possible to provide an active energy beam curable composition which is excellent in properties such as exposure sensitivity, resolution, solvent resistance, in particular very excellent in heat resistance, adhesivity and chemical resistance, and which is excellent in workability and capable of forming an alkali-development type film. It is also possible to provide a printed wiring board having a cured film of such an active energy beam curable composition.

Further, according to this invention, it is possible to provide an active energy beam curable composition which is useful for forming a coated film which is tack-free to an exposure film for forming a patterned image. It is also possible to provide a printed wiring board having a cured film of such an active energy beam curable composition.

The active energy beam curable composition of this invention is suited for use as a photosolder resist composition.

What is claimed is:

1. An active energy beam curable composition comprising;

(A) an active energy beam curable vinyl copolymer modified resin to be derived by adding an epoxy compound represented by the following general formula (4) to part of carboxylic group of a copolymer containing at least monomers represented by the following general formulas (1) and (3) among the monomers represented by the following general formulas (1), (2) and (3);

(B) an active energy beam curable bisphenol type epoxy-acrylate resin;

(C) a reactive diluent;

(D) a photopolymerization initiator; and (E) a thermosetting compound.

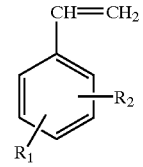

(General formula 1)

wherein $R_1$ represents hydrogen atom or an aliphatic hydrocarbon group having 1 to 6 carbon atoms; and: $R_2$ represents hydrogen atom, hydroxyl group or alkoxyl group.

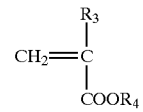

(General formula 2)

wherein $R_3$ represents hydrogen atom or methyl; and $R_4$ represents an aliphatic hydrocarbon group having 1 to 6 carbon atoms or an aromatic group.

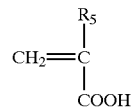

(General formula 3)

wherein $R_5$ represents hydrogen atom or methyl.

(General formula 4)

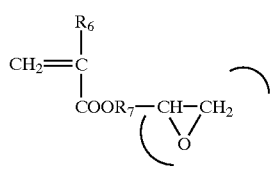

wherein $R_6$ represents hydrogen atom or methyl; $R_7$ represents an alkylene group having 1 to 12 carbon atoms or an aromatic group.

2. The active energy beam curable composition according to claim 1, wherein said active energy beam curable vinyl copolymer modified resin (A) has an average molecular weight of 5,000 to 70,000.

3. The active energy beam curable composition according to claim 1, wherein said active energy beam curable vinyl copolymer modified resin (A) has an acid value of 50 to 150.

4. The active energy beam curable composition according to claim 2, wherein said active energy beam curable vinyl copolymer modified resin (A) has an acid value of 50 to 150.

5. The active energy beam curable composition according to claim 1, wherein the ratio of the monomer represented by the general formula (1) in the copolymer is at least 20 mole %.

6. The active energy beam curable composition according to claim 2, wherein the ratio of the monomer represented by the general formula (1) in the copolymer is at least 20 mole %.

7. The active energy beam curable composition according to claim 3, wherein the ratio of the monomer represented by the general formula (1) in the copolymer is at least 20 mole %.

8. The active energy beam curable composition according to claim 4, wherein the ratio of the monomer represented by the general formula (1) in the copolymer is at least 20 mole %.

9. The active energy beam curable composition according to claim 1, wherein the ratio added of the epoxy compound represented by the general formula (4) to a quantity used of the monomer represented by the general formula (3) in the copolymer is in the range of 20 to 70 mole %.

10. The active energy beam curable composition according to claim 5, wherein the ratio added of the epoxy compound represented by the general formula (4) to a quantity used of the monomer represented by the general formula (3) in the copolymer is in the range of 20 to 70 mole %.

11. The active energy beam curable composition according to claim 1, wherein said active energy beam curable bisphenol type epoxyacrylate resin (B) is a compound to be derived by using as a reactive component a resin selected from the group consisting of bisphenol A epoxy resin, bisphenol F epoxy resin and bisphenol S epoxy resin.

12. The active energy beam curable composition according to claim 10, wherein said active energy beam curable bisphenol type epoxyacrylate resin (B) is a compound to be derived by using as a reactive component a resin selected from the group consisting of bisphenol A epoxy resin, bisphenol F epoxy resin and bisphenol S epoxy resin.

13. The active energy beam curable composition according to claim 1, wherein said reactive diluent (C) is a photopolymerizable monomer, at least one kind of which is employed at a ratio of 2 to 40 g per 100 g of the active energy beam curable vinyl copolymer modified resin (A).

14. The active energy beam curable composition according to claim 12, wherein said reactive diluent (C) is a photopolymerizable monomer, at least one kind of which is employed at a ratio of 2 to 40 g per 100 g of the active energy beam curable vinyl copolymer modified resin (A).

15. The active energy beam curable composition according to claim 1, wherein at least one kind of said photopolymerization initiator (D) is employed at a ratio of 0.2 to 30 g per 100 g of the active energy beam curable vinyl copolymer modified resin (A).

16. The active energy beam curable composition according to claim 14, wherein at least one kind of said photopolymerization initiator (D) is employed at a ratio of 0.2 to 30 g per 100 g of the active energy beam curable vinyl copolymer modified resin (A).

17. The active energy beam curable composition according to claim 1, wherein at least one kind of said thermosetting compound (E) is employed at a ratio of 5 to 100 g per 100 g of the active energy beam curable vinyl copolymer modified resin (A).

18. The active energy beam curable composition according to claim 16, wherein at least one kind of said thermosetting compound (E) is employed at a ratio of 5 to 100 g per 100 g of the active energy beam curable vinyl copolymer modified resin (A).

19. A printed wiring board which is covered with a solder resist film constituted by a cured film of the active energy beam curable compositions according to claim 1.

20. A printed wiring board which is covered with a solder resist film constituted by a cured film of the active energy beam curable compositions according to claim 18.

* * * * *